(12) United States Patent
Baars et al.

(10) Patent No.: US 8,013,377 B2
(45) Date of Patent: Sep. 6, 2011

(54) METHOD FOR PRODUCING AN INTEGRATED CIRCUIT AND ARRANGEMENT COMPRISING A SUBSTRATE

(75) Inventors: Peter Baars, Dresden (DE); Stefan Tegen, Dresden (DE); Klaus Muemmler, Dresden (DE)

(73) Assignee: Qimonda AG, Munich (DE)

( * ) Notice: Subject to any disclaimer, the term of this patent is extended or adjusted under 35 U.S.C. 154(b) by 206 days.

(21) Appl. No.: 12/269,612

(22) Filed: Nov. 12, 2008

(65) Prior Publication Data

US 2009/0121315 A1    May 14, 2009

(30) Foreign Application Priority Data

Nov. 13, 2007    (DE) .......................... 10 2007 054 077

(51) Int. Cl.
*H01L 27/108*    (2006.01)
*H01L 29/76*    (2006.01)
*H01L 29/94*    (2006.01)
*H01L 31/119*    (2006.01)

(52) U.S. Cl. . 257/303; 257/306; 257/309; 257/E27.086; 257/E27.087

(58) Field of Classification Search .................. 257/303, 257/304, 306, 307, 308, 309, 310, E27.086, 257/E27.087, E27.088
See application file for complete search history.

(56) References Cited

U.S. PATENT DOCUMENTS

| 7,064,028 B2 | 6/2006 | Ito et al. |
| 7,439,152 B2 | 10/2008 | Manning |
| 2006/0073670 A1 | 4/2006 | Bae et al. |

FOREIGN PATENT DOCUMENTS

DE    102004053095    8/2005

*Primary Examiner* — Hoai v Pham
(74) *Attorney, Agent, or Firm* — Patterson & Sheridan, LLP

(57) ABSTRACT

Embodiments of the invention relate to an integrated circuit comprising a carrier, having a capacitor with a first electrode and a second electrode. The first electrode has a dielectric layer A layer sequence is arranged on the carrier, the capacitor being introduced in said layer sequence, wherein the layer sequence has a first supporting layer and a second supporting layer arranged at a distance above the first supporting layer, wherein the first and the second supporting layer adjoin the first electrode of the capacitor. Methods of manufacturing the integrated circuit are also provided.

6 Claims, 10 Drawing Sheets

METHOD FOR PRODUCING AN INTEGRATED CIRCUIT AND ARRANGEMENT COMPRISING A SUBSTRATE

CROSS-REFERENCE TO RELATED APPLICATIONS

This application claims foreign priority benefits under 35 U.S.C. §119 to co-pending German patent application number DE 10 2007 054 077.0-33, filed 13 Nov. 2007. This related patent application is herein incorporated by reference in its entirety.

FIELD

The invention relates to a method for producing an integrated circuit, and to an arrangement comprising a carrier.

BACKGROUND

Various methods for producing an arrangement comprising at least one electrode layer are known in the prior art. By way of example, it is known from the U.S. Pat. No. 7,067,385 B2 to produce a capacitor for a semiconductor circuit by producing a dielectric structure that supports a bottom plate of the capacitor during the processing of the wafer. The supporting structure is used for supporting the bottom plate during the removal of a dielectric base layer in order to uncover the outer side of the bottom plate. The supporting structure supports the bottom plate during further processing.

A similar method is furthermore known from DE 102004021399 B3 which describes a production method for a stacked capacitor array having a regular arrangement of a plurality of stacked capacitors. This method involves producing hollow cylinders for a stacked capacitor, wherein an insulator layer is formed between the capacitors in order to support the hollow cylinders.

BRIEF DESCRIPTION OF THE DRAWINGS

So that the manner in which the embodiments of the present invention are attained and can be understood in detail, a more particular description of the invention, briefly summarized above, may be had by reference to the embodiments illustrated in the appended drawings.

Note, however, that the appended drawings illustrate only typical embodiments of this invention and are therefore not to be considered limiting of its scope, for the invention may admit to other equally effective embodiments.

DETAILED DESCRIPTION

Figure 1:
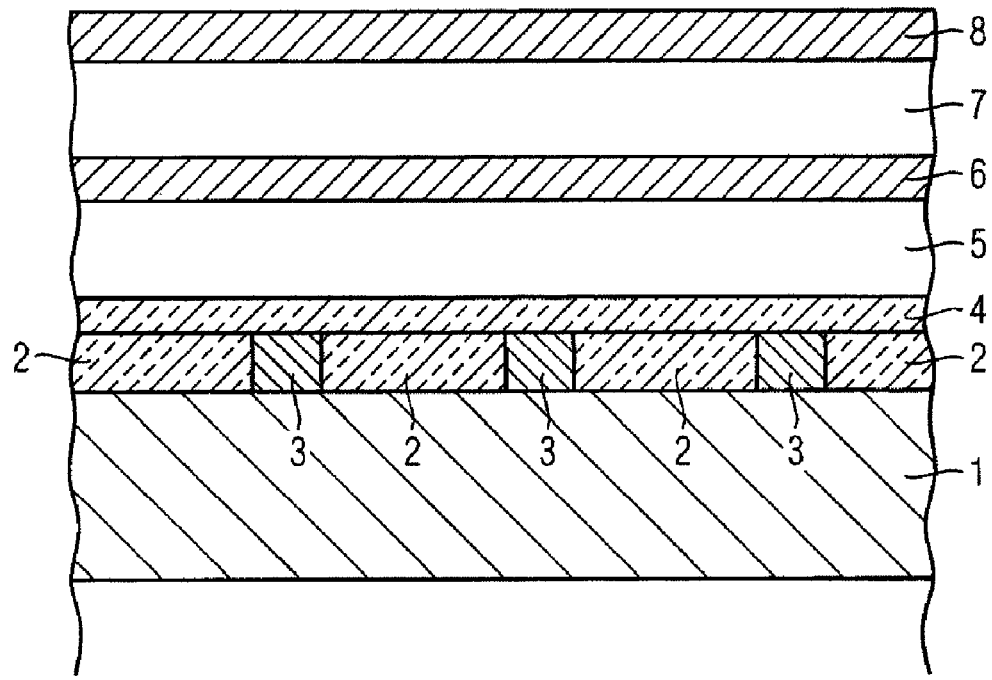
FIG. 1 shows a cross section through a stack of layers, according to one embodiment.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Embodiments of the present invention provide arrangements comprising at least one first electrode layer, and a method for producing the same.

Some embodiments of the method and the arrangement can have the advantage that the first electrode layer is better supported and is therefore more robust toward damage. This advantage can be achieved by providing a first and a second supporting layer, which support the first electrode layer at different levels.

In a further embodiment, the first and the second supporting layers are formed with the same area structure. This can afford the advantage that the production of the two supporting layers can be performed in a simple manner since the same processes and/or the same masks can be used.

In a further embodiment of the method, the first cutouts have a larger cross section than the second cutouts in a plane parallel to the first and second supporting layers. What can be achieved in this way is that the first electrode layers only partly adjoin a first and a second supporting layer. As a result, firstly the mechanical stability of the first electrode layers is increased, and secondly enough free space is created to remove the sacrificial layers or to allow application of a dielectric layer on an outer side of the electrode layer.

In a further embodiment, when filling the first cutouts with the sacrificial material, the second supporting layer is overfilled and a third sacrificial layer is formed on the second supporting layer. In addition, a third supporting layer can be applied to the third sacrificial layer. An additional support of the electrode layer can be made possible in this way.

Depending on the embodiment chosen, the first supporting layer can be patterned with an individual form of cutouts and temporally before the second supporting layer.

In a further embodiment, the first and the second supporting layer are patterned jointly in a patterning method.

In a further embodiment, the first supporting layer is arranged in the middle third of the height, i.e. between ⅓ and ⅔ of the height of the first electrode.

FIG. 1 shows a one embodiment of a carrier, which can be embodied in the form of a substrate 1, on which a first insulation layer 2 is applied, electrical contacts 3 being introduced in said insulation layer. The substrate can be produced from silicon, for example. Furthermore, the first insulation layer 2 can be produced from silicon oxide, for example. The contacts 3 can comprise polysilicon. A second insulation layer 4 can be applied on the first insulation layer 2. The second insulation layer 4 can be formed from silicon nitride ($Si_3N_4$), for example. A first sacrificial layer 5 is arranged on the second insulation layer 4 or directly on the first insulation layer 2. The first sacrificial layer 5 can be formed from silicon oxide, for example. A first supporting layer 6 is arranged on the first sacrificial layer 5. The first supporting layer 6 can be formed from silicon nitride, for example. A second sacrificial layer 7 is arranged on the first supporting layer 6. The second sacrificial layer 7 can be formed from silicon oxide, for example. A second supporting layer 8 is arranged on the second sacrificial layer 7. The second supporting layer 8 can likewise be formed from silicon nitride.

Figure 2:
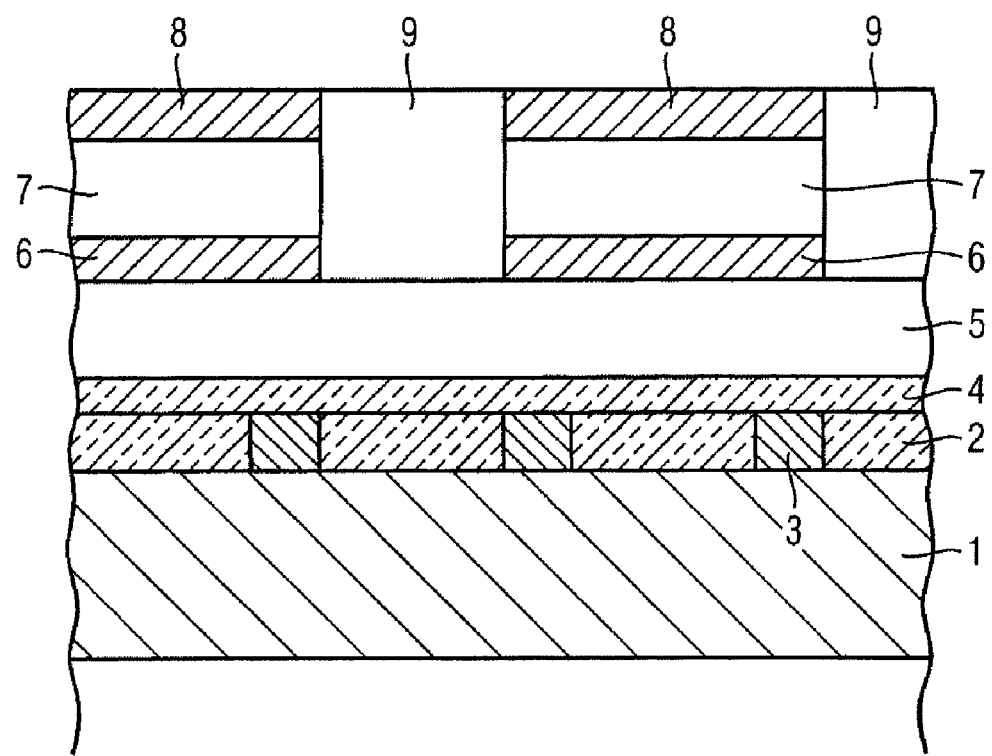
FIG. 2 shows a cross section through a stack of layers with a patterned first supporting layer and a patterned second supporting layer, according to one embodiment.

In a subsequent method step, illustrated in FIG. 2, first cutouts (openings) 9 are introduced from above into the second supporting layer 8, the second sacrificial layer 7 and the first supporting layer 6. For introducing the cutouts 9, lithographic methods and dry etching methods, for example, can be employed in order to remove the first and the second supporting layer 8, 6 and the second sacrificial layer 7 in the corresponding regions. For this purpose, by way of example, a hard mask can be applied to the second supporting layer 8 and the first cutouts 9 can subsequently be introduced into the first and second supporting layer 6, 8 and into the second sacrificial layer 7 by means of dry etching methods using the hard mask.

Figure 3:
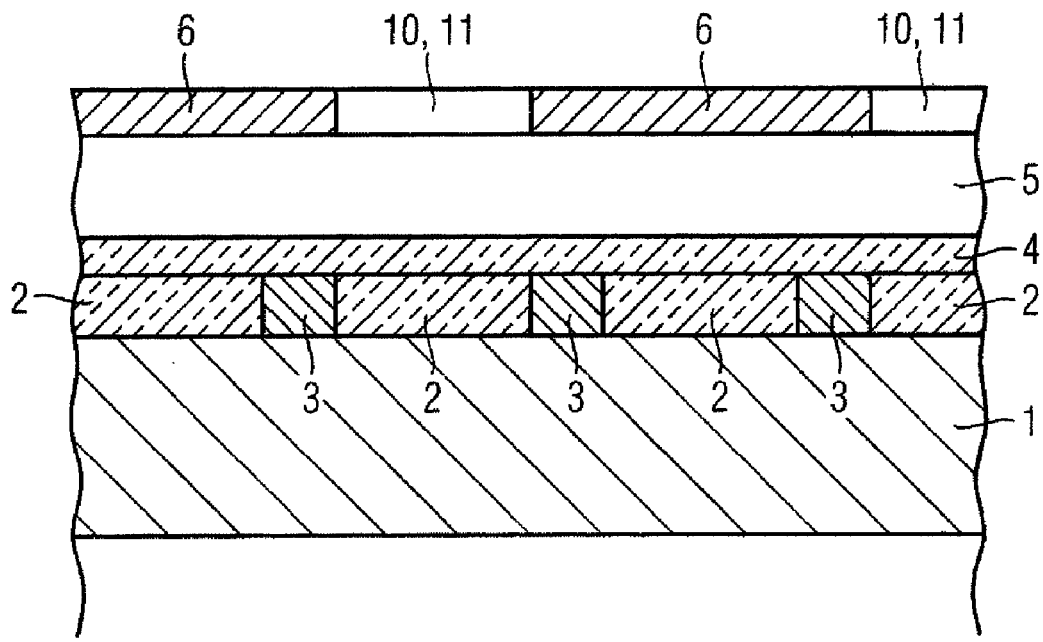
FIG. 3 shows a further embodiment of a layer arrangement with a patterned first supporting layer.
Figure 4:
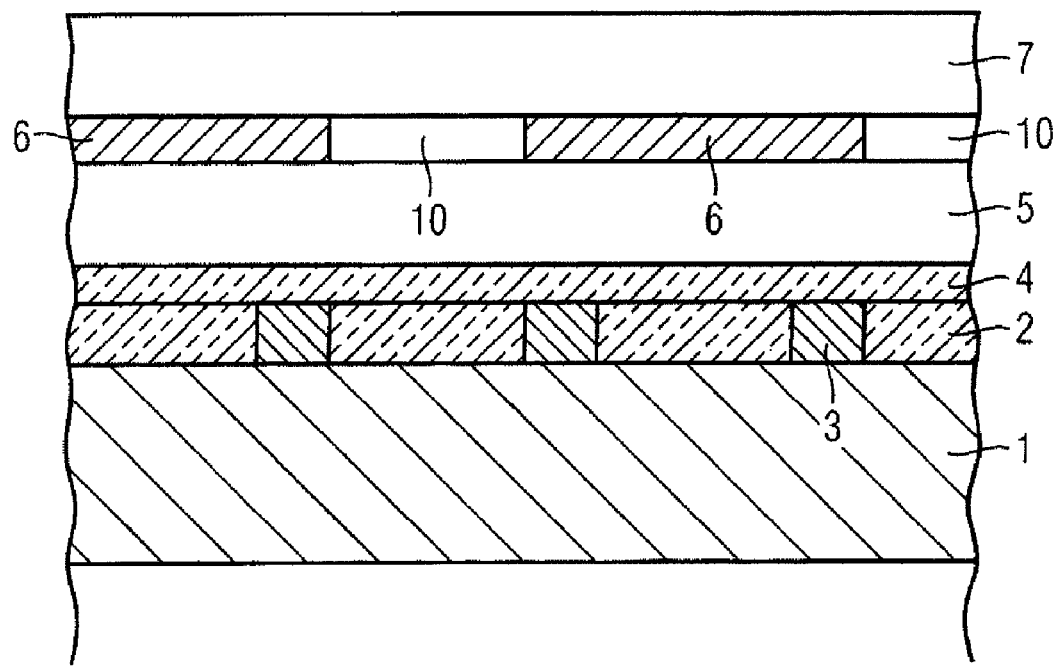
FIG. 4 shows a stack having a layer arrangement with a patterned first supporting layer and a second sacrificial layer arranged thereon, according to one embodiment.

FIGS. 3 to 6 show another embodiment of a method sequence which can be used to obtain a layer arrangement in accordance with FIG. 2. In this case, as illustrated in FIG. 3, the method proceeds from a layer arrangement in which a first insulation layer 2 with contacts 3 is applied to a substrate 1. A second insulation layer 4 is arranged on the first insulation layer 2 and the contacts 3. A first sacrificial layer 5 is arranged on the second insulation layer 4. A first supporting layer 6 is applied on the first sacrificial layer 5. The first supporting layer 6 is removed again in predetermined first regions 10, such that a patterned first supporting layer 6 is obtained. First further cutouts 11 are thus produced in the first regions 10. Afterward, as illustrated in FIG. 4, a sacrificial material is applied to the first supporting layer 6 and into the first further cutouts 11 and a second sacrificial layer 7 is formed. In this embodiment, the first further cutouts 11 are also filled with the sacrificial material. Silicon oxide, for example, is used as sacrificial material. The materials for the substrate 1, the first insulation layer 2, the electrical contacts 3, the second insulation layer 4, the first sacrificial layer 5, the first supporting layer 6 and the second sacrificial layer 7 correspond to the materials of the corresponding layers of the layer arrangement in FIG. 2.

Figure 5:
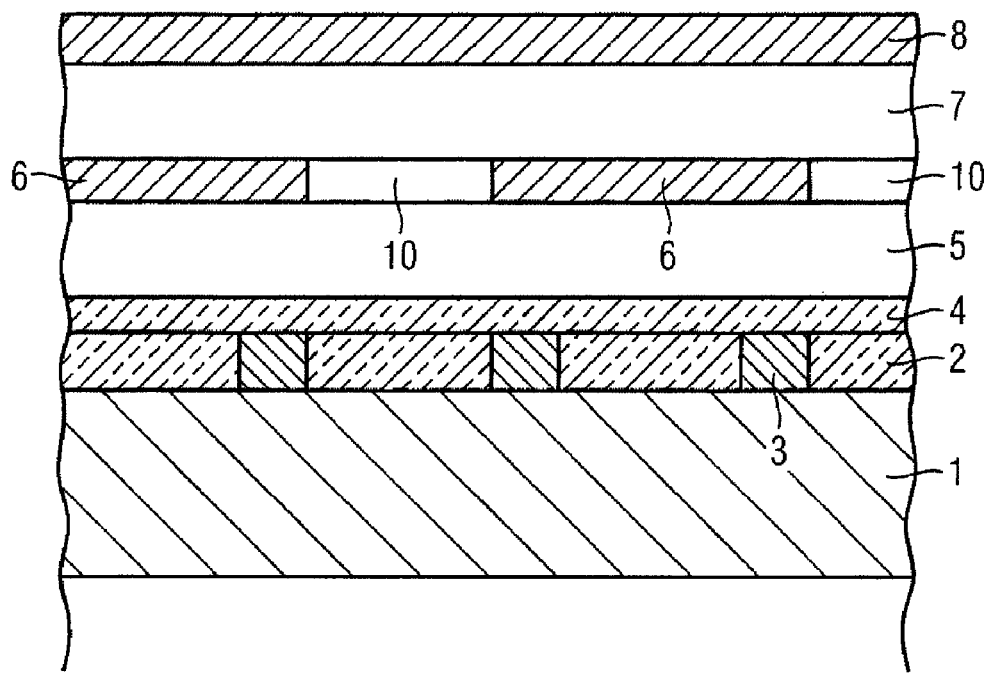
FIG. 5 shows a layer arrangement with a second sacrificial layer and an unpatterned supporting layer arranged thereon, according to one embodiment.
Figure 6:
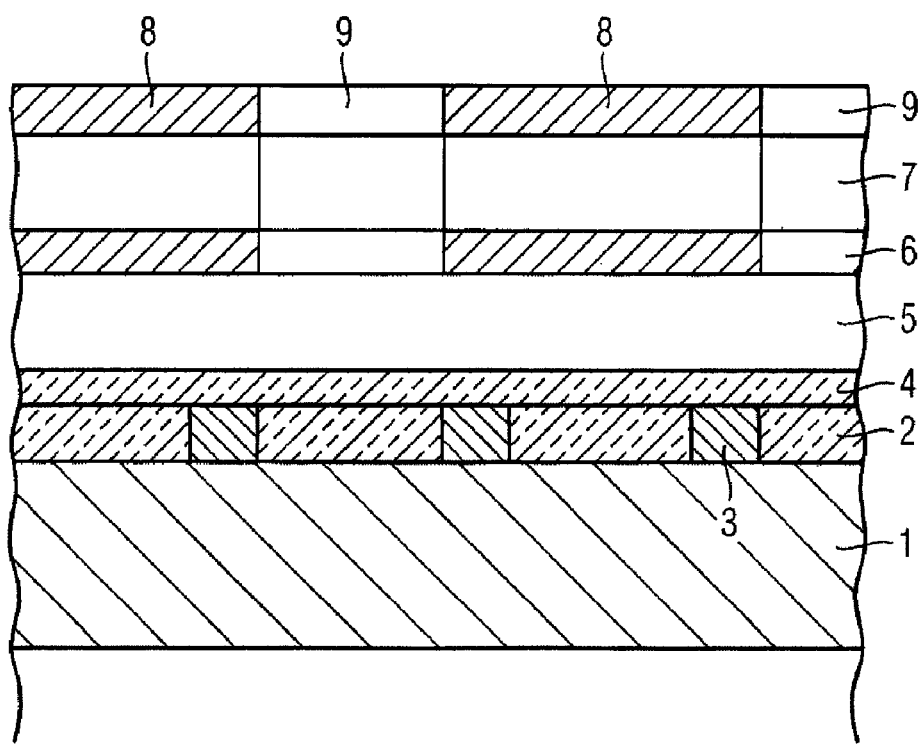
FIG. 6 shows a layer arrangement with a first and a second structured supporting layer, according to one embodiment.

In a subsequent method step, illustrated in FIG. 5, a second supporting layer 8 is applied to the second sacrificial layer 7. First cutouts (openings) 9 are subsequently introduced into the second supporting layer 8 in a manner so that the first cutouts 9 and the further first cutouts 11 are vertically registered with each other. In this way, patterned first and second supporting layers 6, 8 are obtained which have an identical structure in accordance with the embodiment chosen and are illustrated in FIG. 6.

In a further embodiment, the first and the second supporting layer 6, 8 can also be formed differently; in particular, the layer thicknesses, the layer materials, and the number of first and further first cutouts 9, 11 can vary. In addition, the shapes and sizes of the first and of the further first cutouts 9, 11 can also vary.

The size of the first cutouts 9 is defined in such a way that the etching processes and the deposition processes can be performed efficiently.

Figure 7:
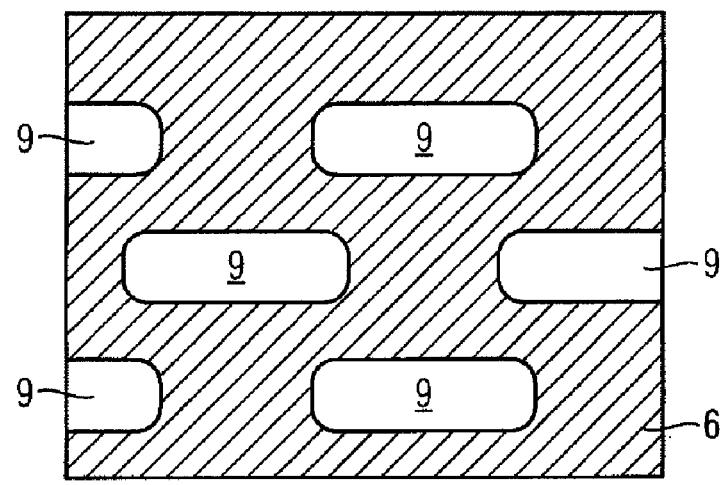
FIG. 7 shows a view from above of the first patterned supporting layer, according to one embodiment.

FIG. 7 shows a plan view of a patterned first supporting layer 6, in which the first cutouts 9 have been introduced. The second patterned supporting layer 8 is formed identically. The first cutouts 9 of the first and second supporting layers 6, 8 have a rounded rectangular shape, in particular an elliptic shape, in cross section parallel to the first and the second supporting layer 6, 8.

The first cutouts 9 are arranged in such a way that a first cutout 9 is arranged above an intermediate region formed between two adjacent electrical contacts 3. Depending on the embodiment chosen, the base areas of the first cutouts 9 are chosen and arranged in this way such that a cutout 9 is arranged with the base area at least partly above two adjacent contacts 3.

Figure 8:
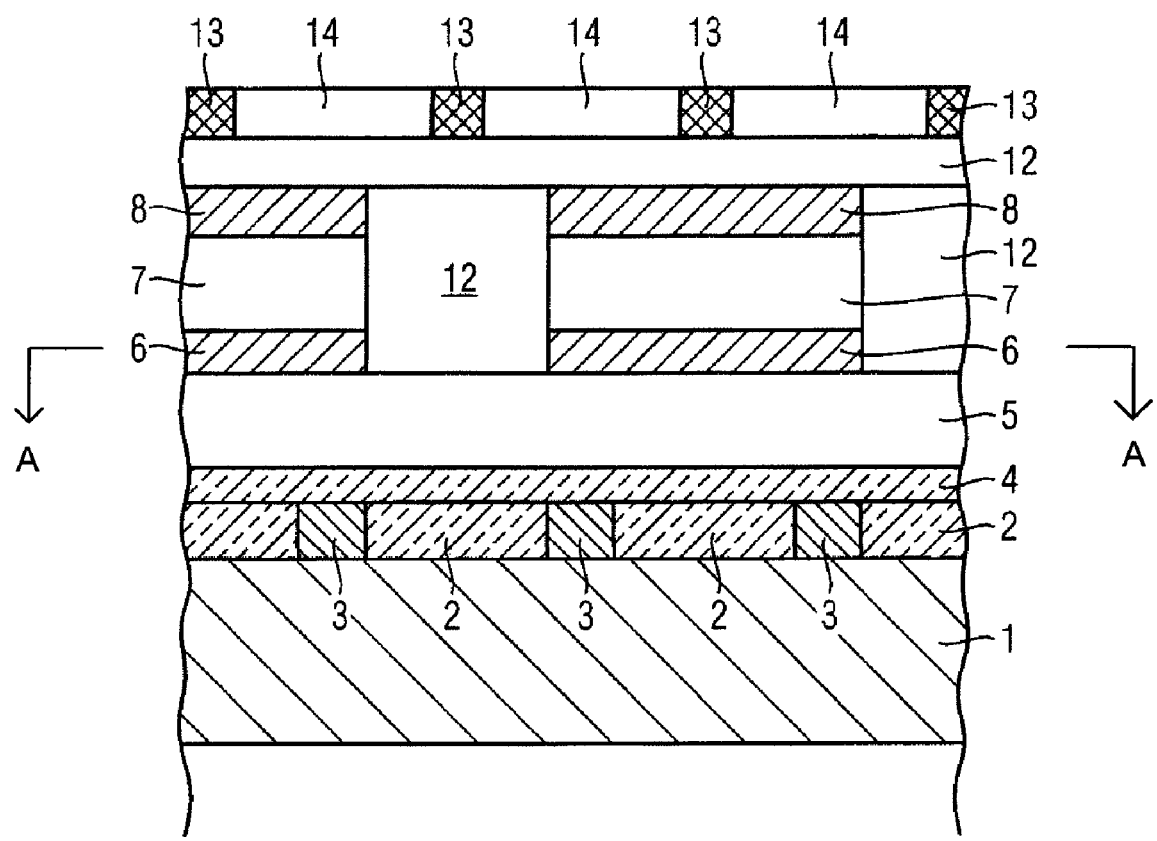
FIG. 8 shows a layer arrangement with a third sacrificial layer and a patterned third supporting layer, according to one embodiment.

FIG. 8 shows a further method step, which follows the method step in accordance with FIG. 2 or the method step in accordance with FIG. 6. In this case, the cutouts 9 are filled with a sacrificial material and a third sacrificial layer 12 is additionally formed on the second supporting layer 8. Silicon oxide, for example, can be used as sacrificial material. The third sacrificial layer 12 can thus be formed from silicon oxide, for example. In this case, the cutouts 9 are completely filled. A hard mask layer 13 is formed on the third sacrificial layer 12. The hard mask layer 13 is patterned, such that a hard mask is obtained. The patterned hard mask layer 13 has second cutouts 14, which expose the underlying third sacrificial layer 12 for subsequent removal by an etching method. The second cutouts 14 are registered with the location of the electrical contacts 3, as illustrated in FIG. 8.

Figure 9:
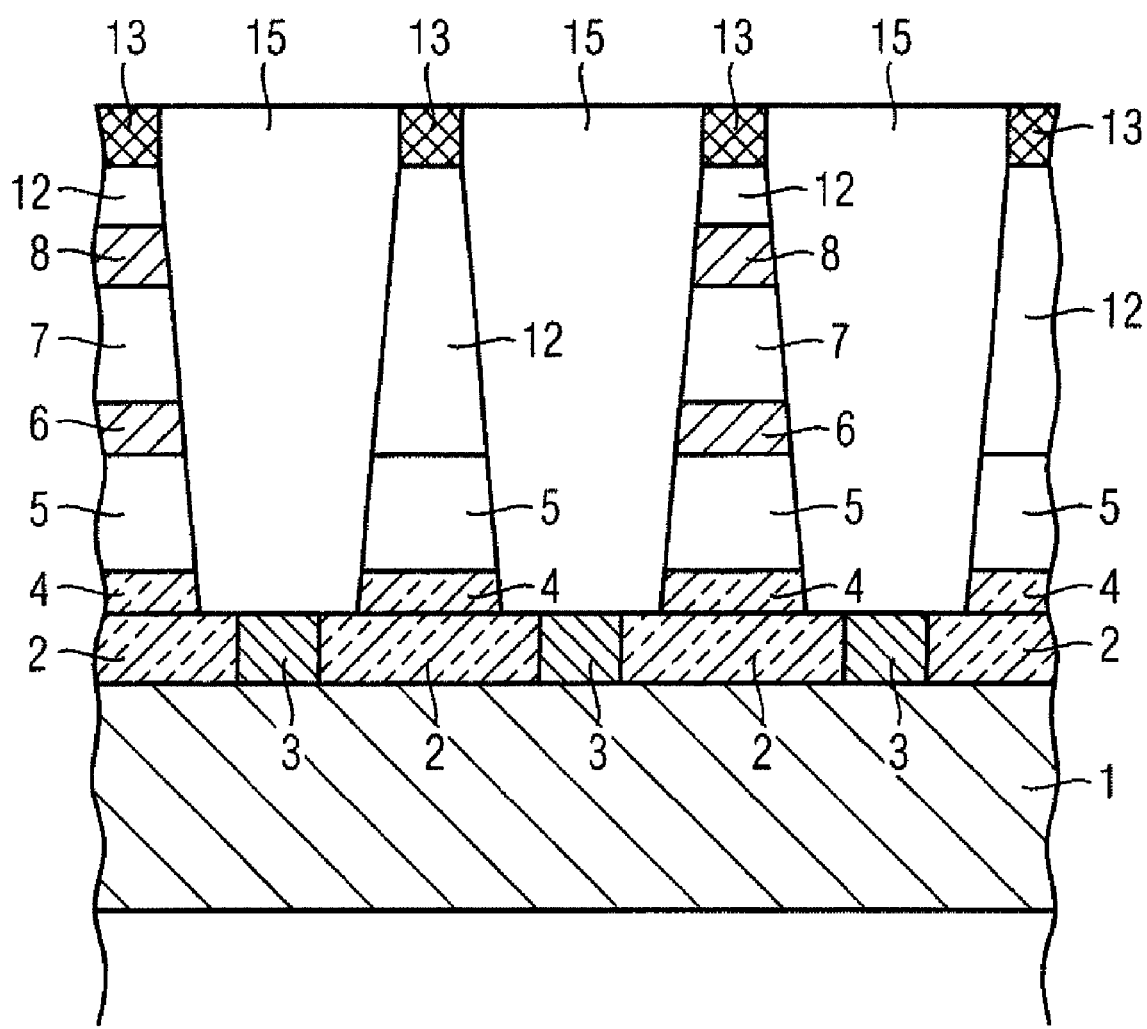
FIG. 9 shows a layer arrangement with second cutouts, according to one embodiment.

In a further method step, using the patterned hard mask layer 13, via the second cutouts 14, third cutouts 15 are introduced into the third sacrificial layer 12, the second supporting layer 8, the second sacrificial layer 7, the first sacrificial layer 6, the first supporting layer 6, the first sacrificial layer 5 and into the second insulation layer 4. This method state is illustrated in FIG. 9. The third cutouts thus project as far as the electrical contacts 3 and the first insulation layer 2. On account of the etching methods used, the third cutouts 15 can have a downwardly slightly conically tapering form in cross section.

Figure 10:
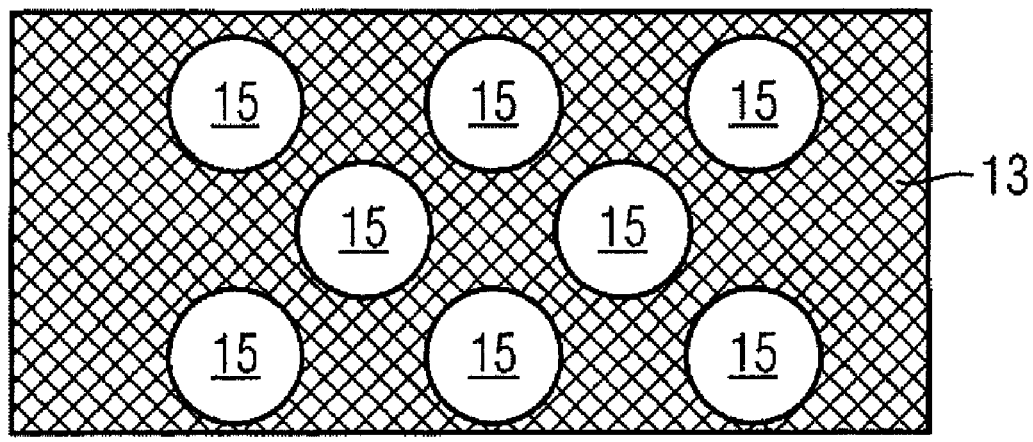
FIG. 10 shows a view from above of the openings of the second cutouts in the plane of the third supporting layer, according to one embodiment.

FIG. 10 shows a plan view of the patterned hard mask layer 13 with the third cutouts 15.

Figure 11:
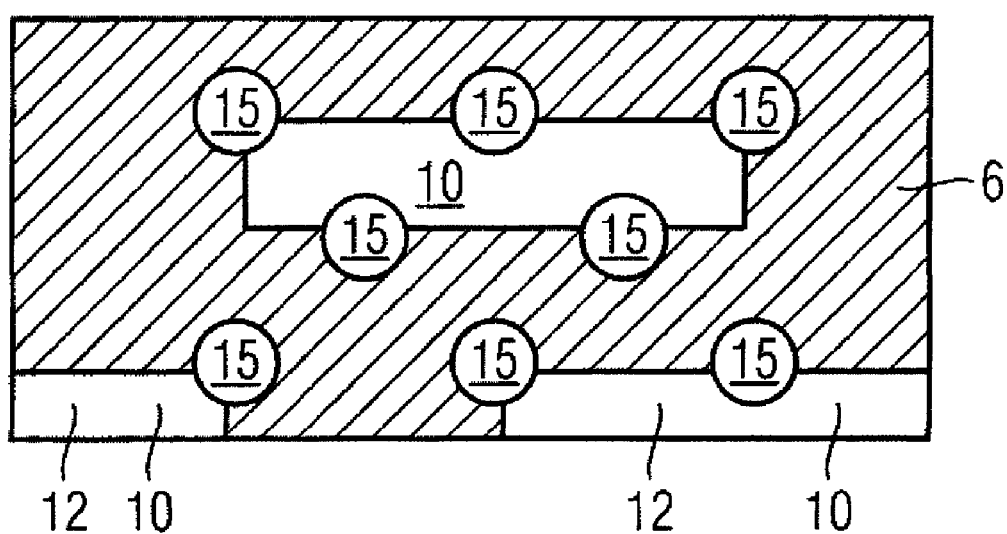
FIG. 11 shows a horizontal section through the first supporting layer, according to one embodiment.

FIG. 11 shows a cross section (taken at line A-A of FIG. 8) through the first supporting layer 6, wherein the first regions 10 are clearly illustrated, said first regions being filled with the sacrificial material of the third sacrificial layer 12. The third cutouts 15 are arranged in such a way that the third cutouts 15 are arranged partly in the first supporting layer 6 and partly in the first region 10 of the supporting layer 6.

The cross section through the second supporting layer 8 also has a corresponding appearance, said second supporting layer likewise having first regions 10 in which sacrificial material of the third sacrificial layer 12 is arranged. The first regions 10 of the first supporting layer 6 can be of just the same size as the first regions 10 of the second supporting layer 8. In the embodiment chosen, each cutout 15 at least partly adjoins the first and the second supporting layer 6, 8. Thus, the first electrodes to be created in the cutouts 15 also adjoin the first and the second supporting layer 6, 8.

Figure 12:
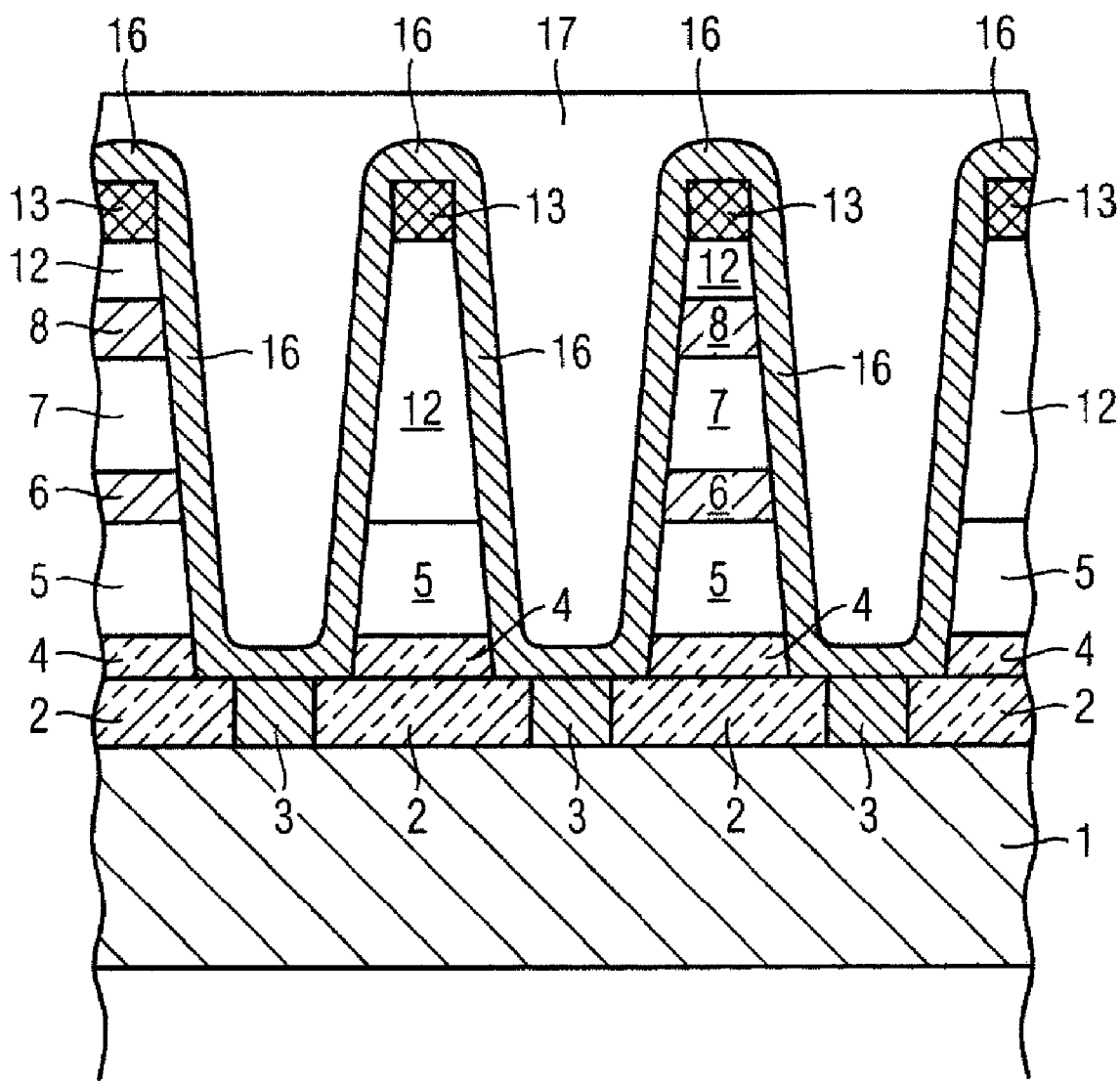
FIG. 12 shows a layer arrangement with a deposited first electrode layer which is overfilled with a sacrificial material, according to one embodiment.

In a further method step, illustrated by FIG. 12, a first electrode layer 16 is applied to the arrangement from FIG. 9. In this case, the first electrode layer 16 is applied to the sidewalls and floors of the third cutouts 15, and to the patterned hard mask layer 13. The thickness of the first electrode layer 16 is so small that furthermore a portion of the third cutouts 15 is not filled. Afterwards, a sacrificial material is introduced into the still open regions of the third cutout 15 and the structure is overfilled. A fourth sacrificial layer 17 is thus applied. Silicon oxide, for example, can be used as sacrificial material.

In a subsequent method step, the fourth sacrificial layer 17 is removed by means of a CMP process to an extent such that the patterned hard mask layer 13 is likewise uncovered. In a further method step, the patterned hard mask layer 13 can be removed in the regions in which the patterned hard mask layer 13 is arranged over the second supporting layer 8.

Figure 13:
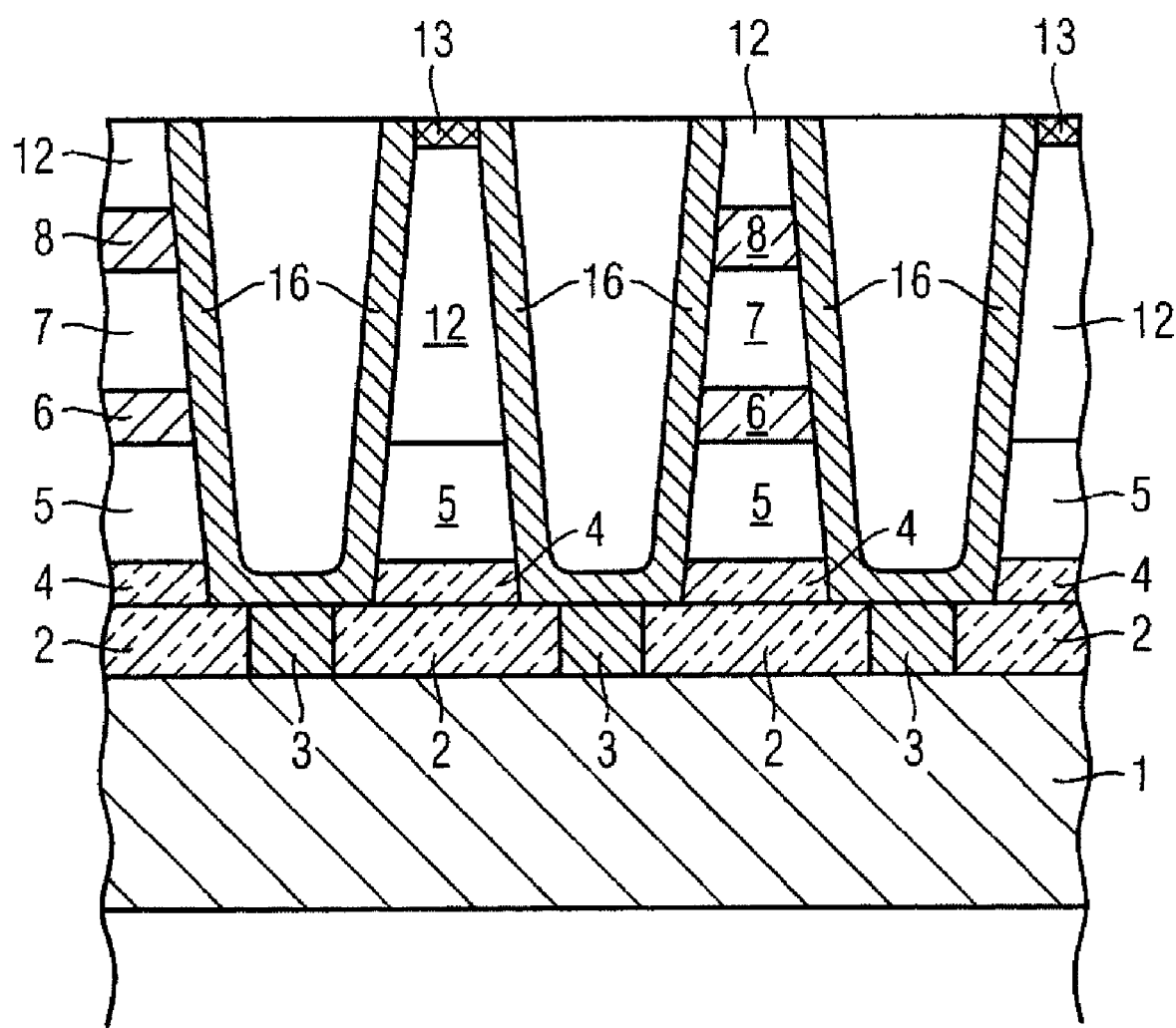
FIG. 13 shows a layer arrangement with electrically isolated first electrodes filled with a sacrificial material, according to one embodiment.
Figure 14:
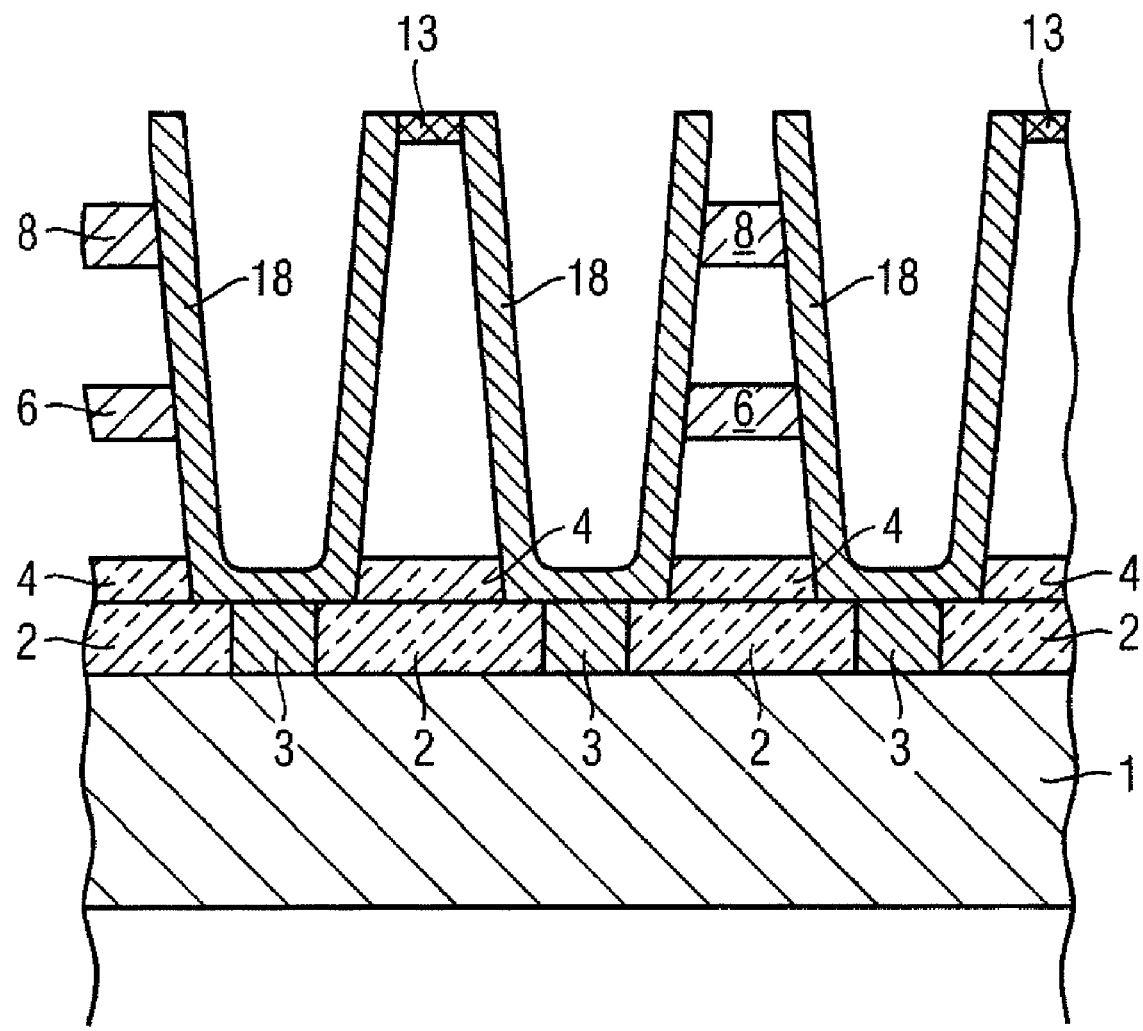
FIG. 14 shows a layer arrangement with first electrodes which are uncovered, according to one embodiment.

This method state is illustrated in FIG. 13.

In a further method step, the third sacrificial layer 12, the second sacrificial layer 7 and the first sacrificial layer 5 are removed with the aid of isotropic, e.g. wet-chemical, etching methods. In this case, the access on the part of the etchant to the lower sacrificial layers 5, 7 and the removal thereof take place through the first and further cutouts 9, 11 of the supporting layers 6, 8. An arrangement having first electrodes 18 thus remains, which electrodes are connected to one another via the first and second supporting layers 6, 8 and the hard mask layer 13. The first electrodes 18 are pot-shaped, i.e., frusto-conical in which the openings of the first electrodes 18 are wider than their respective bases that contact the electrical contracts 3. This method state is illustrated in FIG. 13. Depending on the embodiment chosen, the hard mask layer 13 can also be dispensed with, such that the first electrodes 18 are connected to one another only via the first and second supporting layers 6, 8. A dielectric layer 19 is subsequently deposited onto the first electrodes 18. The dielectric layer 19 is deposited by means of an ALD method (atomic layer deposition method), for example, such that the inner and outer sides of the electrodes 18 are covered with the dielectric layer. The free areas of the first and second supporting layers 6, 8 and of the hard mask 13 are also covered with the dielectric layer in this case. In addition, the free areas of the second insulation layer 4 are also covered with the dielectric layer 19. Materials having a high K value can be used as dielectric material.

In a further method step, a second electrode layer 20 is subsequently deposited onto the dielectric layer 19. Various metals, for example tungsten, titanium nitride or titanium, or mixtures and/or layer systems comprising tungsten, titanium nitride and titanium, can be used as material for the first and the second electrode layer 16, 20.

Figure 15:
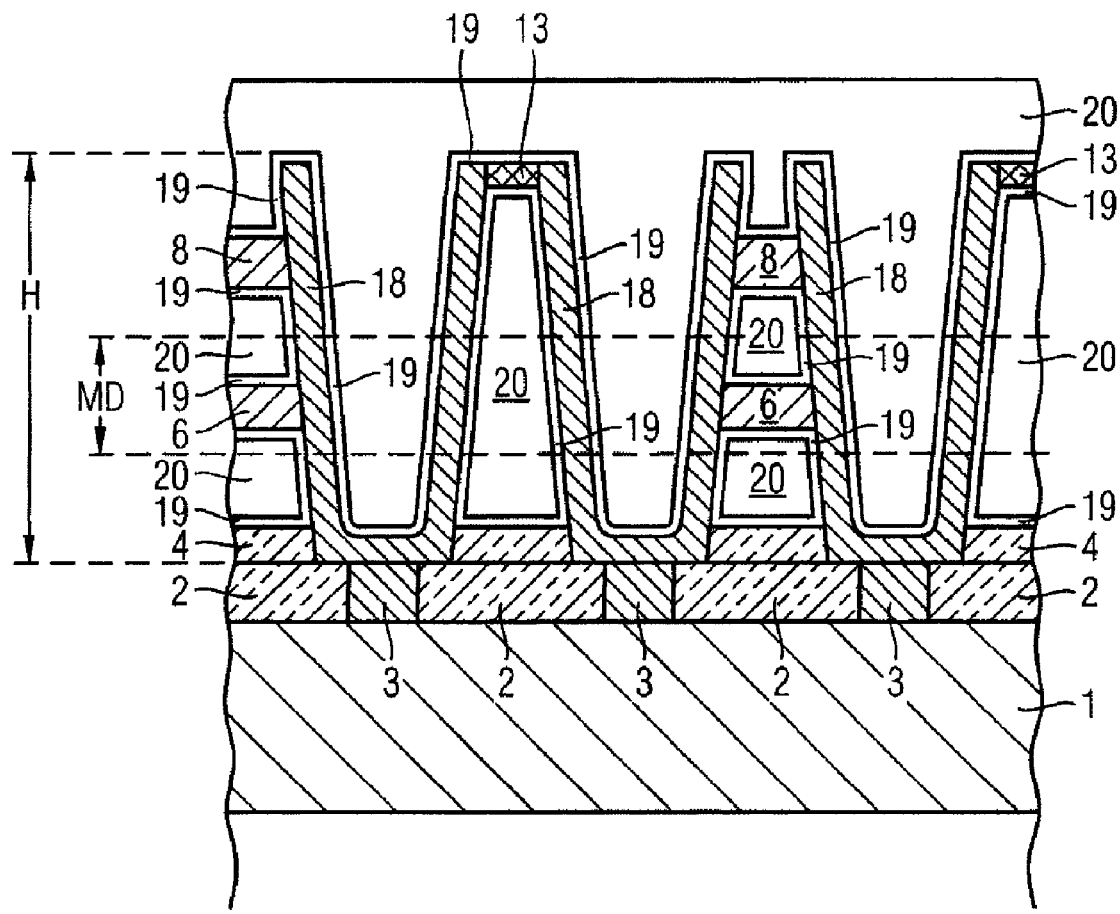
FIG. 15 shows a layer arrangement with first electrodes which are covered with a dielectric layer, and with a second electrode.

A common electrode layer can be applied to the electrode layer 20 and the structure can be filled, as is illustrated in FIG. 15. In FIG. 15, the second electrode layer 20 is formed in such a way that the entire structure is overfilled.

An arrangement comprising capacitors embodied in the form of pot-shaped elements which are at least partly connected to one another via a first and a second supporting layer 6, 8 is obtained in this way.

The first electrode layer can have a thickness within the range of 5 to 20 nm, and 10 nm in a particular embodiment. The first and the second supporting layer can have a thickness within the range of 30 to 120 nm, according to one embodiment.

FIG. 15 depicts a height H of the first electrodes 18. In one embodiment, the first supporting layer 6 is arranged in the middle third MD of the height H. Good stabilization of the first electrodes 18 is achieved in this way. The first and the second sacrificial layer 5, 7 can for example also comprise carbon, Si—Ge or doped SiO2. The supporting layers 6, 8 can be produced from different materials, wherein the supporting layers can be produced from electrically insulating material in order that the sacrificial layers can be etched selectively with respect to the supporting layers.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising:
a carrier, the carrier comprising:
a capacitor, the capacitor comprising a first electrode, a dielectric layer, and a second electrode;
a first supporting layer; and
a second supporting layer arranged at a greater distance from a substrate than the first supporting layer, and the first supporting layer arranged at a greater distance from the substrate than a portion of the first electrode of the capacitor,
wherein respective portions of the first and second supporting layers are between respective portions of both the first and second electrodes and the substrate.

2. The integrated circuit as claimed in claim 1, wherein at least one insulation layer is formed on the carrier, the insulating layer including a contact extending from the carrier to the first electrode of the capacitor.

3. The integrated circuit as claimed in claim 1, wherein the first and the second supporting layers have substantially identical cross-sectional areas.

4. The integrated circuit as claimed in claim 1, wherein the first and the second supporting layers comprise the same material.

5. The integrated circuit as claimed in claim 1, wherein the first electrodes are formed in pot-shaped fashion having a height relative to the substrate, wherein the first supporting layer is arranged in a middle third of the height.

6. The integrated circuit as claimed in claim 1, wherein a portion of the second electrode at a same distance from the substrate as the first or second supporting layer is between a second portion of the first electrode and the substrate.

* * * * *